(12) United States Patent
Hesse

(10) Patent No.: US 6,798,067 B2
(45) Date of Patent: Sep. 28, 2004

(54) SWITCHING METAL LINE CONFIGURATIONS IN METAL LAYER STRUCTURES

(75) Inventor: Siegfried Kay Hesse, Dresden (DE)

(73) Assignee: Advanced Micro Devices, Inc., Sunnyvale, CA (US)

(*) Notice: Subject to any disclaimer, the term of this patent is extended or adjusted under 35 U.S.C. 154(b) by 119 days.

(21) Appl. No.: 10/327,157

(22) Filed: Dec. 20, 2002

(65) Prior Publication Data

US 2004/0087132 A1 May 6, 2004

(30) Foreign Application Priority Data

Oct. 31, 2002 (DE) .......................................... 102 50 887

(51) Int. Cl.[7] .............................................. H01L 23/48
(52) U.S. Cl. ...................................... 257/758; 257/773
(58) Field of Search ................................ 257/758, 773, 257/211

(56) References Cited

U.S. PATENT DOCUMENTS 5,196,362 A * 3/1993 Suzuki ........................ 438/599

FOREIGN PATENT DOCUMENTS

DE 4128568 8/1991

* cited by examiner

Primary Examiner—Mark V. Prenty
(74) Attorney, Agent, or Firm—Meyertons Hood Kivlin Kowert & Goetzel, P.C.; B. Noël Kivlin (57) ABSTRACT

A method of manufacturing a metal layer structure and a corresponding integrated circuit chip are provided, wherein the integrated circuit chip comprises metal layers and via holes. The via holes electrically connect a metal line of one metal layer with a metal line of another metal layer. The metal lines and via holes form a signal path that electrically connects a first tap with a second tap. The metal lines in each metal layer are arranged in a first predefined configuration. There is for each metal layer a second predefined configuration that arranges the metal lines in the metal layer to form, together with the via holes and the metal lines in the other metal layers, a modified signal path that electrically connects the first tap with a third tap. This technique is particularly useful for storing revision identification data.

21 Claims, 8 Drawing Sheets

SWITCHING METAL LINE CONFIGURATIONS IN METAL LAYER STRUCTURES

BACKGROUND OF THE INVENTION

1. Field of the Invention

The invention generally relates to metal layer structures that comprise via holes and arrangements of metal lines for connecting metal layers, and in particular to a technique to identify a revision of the metal layer structure.

2. Description of the Related Art

Complex semiconductor devices and high-speed circuitry of today's electronics are changing the role of the interconnection substrates. No longer does the substrate just provide a replacement for wires. The interconnecting substrate provides circuit signal matching, terminal management and mechanical support, as well as electrical functionality. These characteristics are needed to support the advancement made in semiconductor technology. The chip complexity increases with reduced chip sizes and reduced contact pitches, and represents challenges for both, the assemblers and board manufacturers. The assemblers have handling problems, coplanarity difficulties and alignment problems. The board manufacturers have to solve size problems, layout mask difficulties and electrical test problems. These high demands require multi-layer or high-density interconnection designs to support the wiring needs for closely spaced devices.

Multi-layer structures include, for instance, 4 to 8 layers and a multi-layer structure is built up in different manufacturing steps. A base of the multi-layer structure is a substrate. By applying e.g. a photosensitive polymer and then exposing the substrate to ultraviolet light through a layout mask that contains the desired circuits, a dielectric is developed and the result is a hard dielectric coating on the substrate containing a circuit pattern in the form of grooves. A conductive material is applied to fill the photo-exposed conductor grooves and holes. The circuit is then dried and cured. A second layer of photo-sensitive dielectric may be then applied and exposed to ultraviolet light through a layout mask containing a pattern for via holes. After developing, the via holes are filled with conductive materials and cured as before. A third layer of photo-sensitive dielectric is then applied. This layer is exposed, developed, filled and cured to provide the circuitry for the second conductor layer. This process can be repeated sequentially to produce a multi-layer structure.

Figure 1:
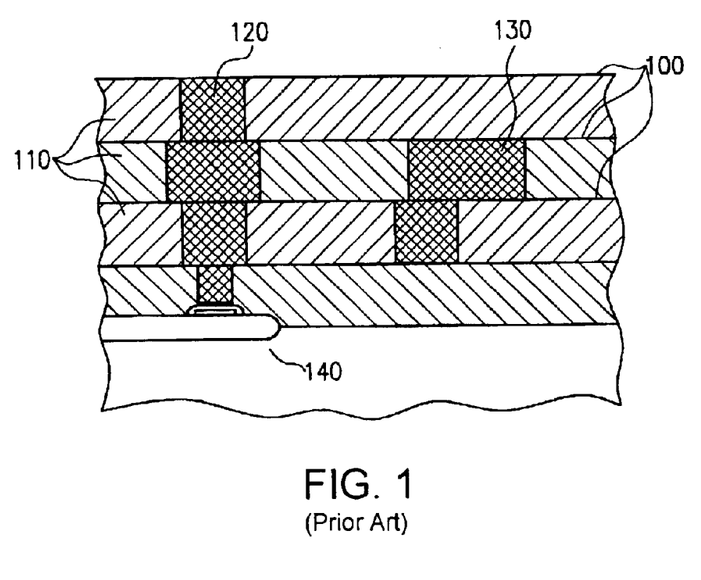
FIG. 1 shows a cross-sectional view of a conventional metal multilayer structure.

The above-described manufacturing steps result, for instance, in a multi-layer structure as illustrated in FIG. 1. As can be seen, the multi-layer structure comprises several layers of dielectric material 110. To the dielectric layers metal layers 100 are applied that are vertically connected by via holes 120, 130. The via holes 120 may be arranged for vertically connecting an electronic device 140 that is embedded in the multi-layer structure, for instance to connect the electronic device 140 with the top metal layer.

The via holes of the structure illustrated in FIG. 1 are positioned according to requirements of the embedded electronic devices, and may further form a connection to certain points on a top metal layer to be bonded to contact pitches, or to provide at a certain metal layer a defined electrical potential.

Assuming, a metal layer structure layout has to be modified, for example to implement corrections of the metal line arrangement, an identification of the metal layer structure may be used to trace the applied modifications and to identify the revision number of the metal layer structure. Generally, the revision number of an integrated circuit chip is software readable, wherein for instance, a software read procedure reads the implemented revision number and may further initiate revision number specific actions. The implementation of such a revision identification technique requires high additional efforts to adapt the layers of the metal layer structure.

The conventional techniques of providing an identification for a metal layer structure may be expensive and disadvantageous because for each adaptation of the revision number it may be necessary to implement additional modifications of the layer structure in the layout mask for several layers. That is, even if the electrical connections of only one metal layer are to be modified for the purpose of correcting layout mistakes or for other reasons, the conventional technique often require to produce modified layout masks for further metal layers, just in order to update the revision number.

A further disadvantage of the conventional techniques may be a waste of chip area. Thus, the application of the conventional techniques result in unnecessarily complicated and cost intensive manufacturing.

SUMMARY OF THE INVENTION

An integrated circuit chip and a manufacturing method are provided that may have improved connectivity characteristics, and that may in particular be suitable for reducing the manufacturing costs when providing identification features.

In one embodiment, there is provided an integrated circuit chip that comprises a metal layer structure that has at least three substantially horizontal metal layers and a plurality of substantially vertical via holes. Each of the metal layers comprises at least one metal line. Each of the via holes electrically connects a metal line of one metal layer with a metal line of another metal layer. The integrated circuit chip further comprises a first tap that is located in a first one of the metal layers, and a second and third tap that are located in a second one of the metal layers. The metal lines and via holes form a signal path that electrically connects the first tap with the second tap. The metal lines in each metal layer are arranged in a respective first one of at least two predefined configurations. The at least two predefined configurations comprise for each metal layer a second predefined configuration that arranges the metal lines in the metal layer to form, together with the via holes and the metal lines in the other metal layers, a modified signal path that electrically connects the first tap with the third tap.

In a further embodiment, there is provided an integrated circuit chip that has a revision identification register that stores revision identification data, and an output port that is connected to the revision identification register to output the revision identification data. The revision identification register comprises a metal layer structure that has at least three substantially horizontal metal layers and a plurality of substantially vertical via holes. Each of the metal layers comprises at least one metal line. Each of the via holes electrically connects a metal line of one metal layer with a metal line of another metal layer. The integrated circuit chip further comprises a first tap that is located in a first one of the metal layers and a second and third tap that are located in a second one of the metal layers. The metal lines and via holes form a signal path that electrically connects the first tap with the second tap. The metal lines in each metal layer are arranged in a respective first one of at least two predefined configurations. The at least two predefined configurations comprise for each metal layer a second predefined configuration that arranges the metal lines in the metal layer to form, together with the via holes and the metal lines in the other metal layers, a modified signal path that electrically connects the first tap with the third tap.

In another embodiment, there is provided a method of manufacturing a metal layer structure that comprises at least three substantially horizontal metal layers and a plurality of substantially vertical via holes. Each of the metal layers comprises at least one metal line. Each of the via holes electrically connects a metal line of one metal layer with a metal line of another metal layer. The structure further comprises a first tap that is located in a first one of the metal layers, and a second and third tap that are located in a second one of the metal layers. The metal lines and via holes form a signal path that electrically connects the first tap with the second tap. The metal lines in each metal layer are arranged in a respective first one of at least two predefined configurations. The at least two predefined configurations comprise for each metal layer a second predefined configuration that arranges the metal lines in the metal layer to form, together with the via holes and the metal lines in the other metal layers, a modified signal path that electrically connects the first tap with the third tap. The method comprises selecting a metal layer of the structure, determining the predefined configuration of metal lines in the selected metal layer, selecting a different predefined configuration, preparing a layout mask for the selected metal layer according to the selected predefined configuration, and structuring a structure using the layout mask.

BRIEF DESCRIPTION OF THE DRAWINGS

The accompanying drawings are incorporated into and form a part of the specification for the purpose of explaining the principles of the invention. The drawings are not to be construed as limiting the invention to only the illustrated and described examples of how the invention can be made and used. Further features and advantages will become apparent from the following, and more particular description of the invention as illustrated in the accompanying drawings, wherein.

DETAILED DESCRIPTION OF THE INVENTION

The illustrative embodiments of the present invention will be described with reference to the figure drawings, wherein like elements and structures are indicated with like reference numbers.

Figure 2:
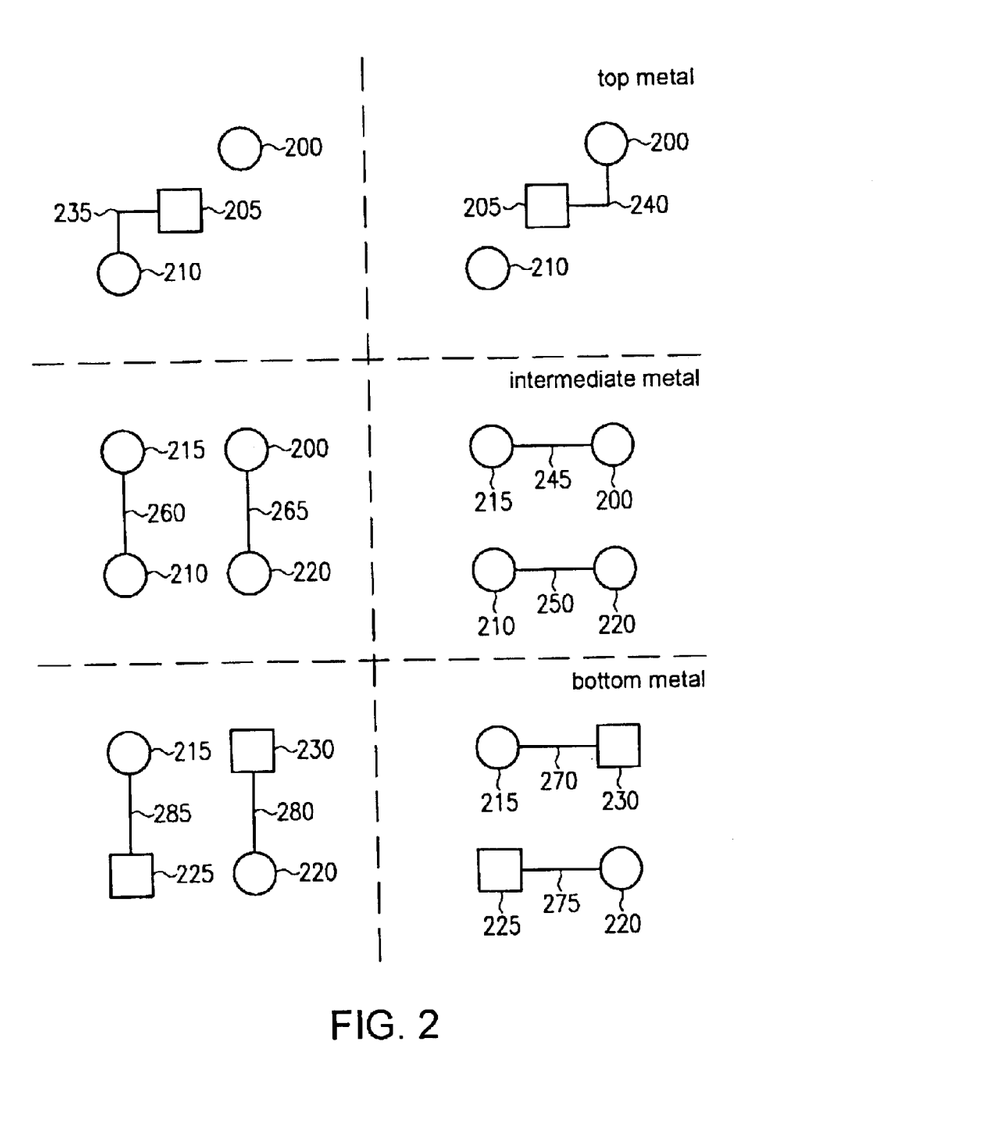
FIG. 2 shows a top view of a three metal layer structure that includes via holes and metal lines arranged according to two predefined configurations for each metal layer, according to one embodiment.

Referring now to the drawings, in particular to FIG. 2 which illustrates a metal layer structure according to one embodiment, the structure is depicted in a top view. The structure has three horizontal metal layers: a top metal, an intermediate metal and a bottom metal layer. The structure comprises a plurality of vertical via holes (or vias, plugs) 200, 210, 215, 220, metal lines 235, 240, 245, 250, 260, 265, 270, 275, 280, 285 and three taps 205, 225, 230.

Taps are signal sources or signal sinks, but can also be other connections to electrical devices, such as tie-cells, power grid connections or pull-up/down resistors. In other embodiments, at least some of the taps may even be left floating.

The via holes vertically connect a metal line of one metal layer with a metal line of another metal layer. Each of the metal layers comprises an arrangement of metal lines connected to via holes, wherein the metal lines are arranged according to a first or a second configuration for each metal layer. In each layer, the first configuration is depicted on the left hand side of FIG. 2 while the second configuration is shown on the respective right part of the figure. A selection of either the first or the second configuration of each metal layer forms one signal path, either from the tap 205 that is located in the top metal layer to the tap 225 or to the tap 230 that are both located in the bottom metal layer.

Assuming, a signal path is realized in the structure from the tap 205 to the tap 230 according to the respective second predefined configurations, then the metal lines 240, 245 and 270 are used. If only one arrangement of metal lines in one metal layer changes from the second configuration to the respective first configuration, then another signal path is formed, together with the remaining metal lines and via holes, to connect tap 205 with the second tap 225 in the bottom metal layer.

This construction of via holes and metal lines may be used to connect one of several signal sources with, for instance, a signal sink. Accordingly, the above-described tap 205 may be a signal sink, and the taps 225 and 230 are the signal sources.

It is to be noted, that the construction of via holes and metal lines of FIG. 2 also can be used to connect one signal source with one of several signal sinks.

Figure 3:
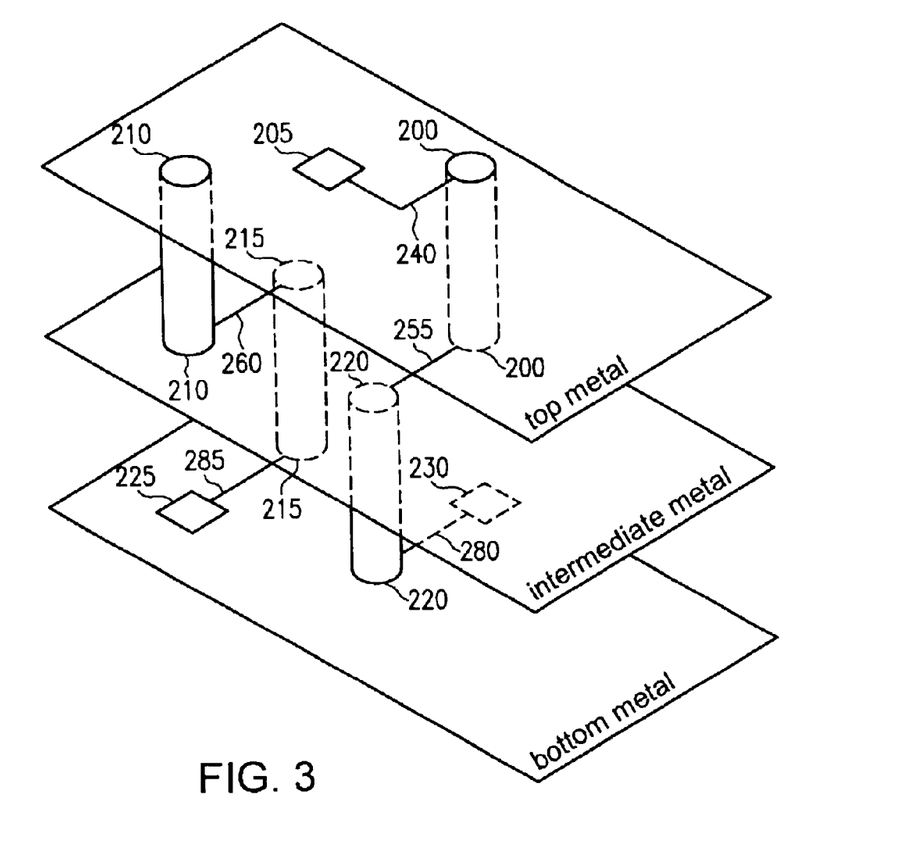
FIG. 3 shows a perspective view of the structure shown in FIG. 2.

With reference to FIG. 3, the metal layer structure of FIG. 2 is perspectively depicted and shows a signal path that connects tap 230 to tap 205 by using the second configuration of the metal lines in the top metal layer and the respective first configurations in the intermediate and bottom metal layer. The illustration further shows that the depicted layer structure advantageously uses less chip area, because the via hole 200 has the same horizontal coordinates as the tap 230 in the bottom metal layer, so that they are vertically located one upon the other.

Figure 4:
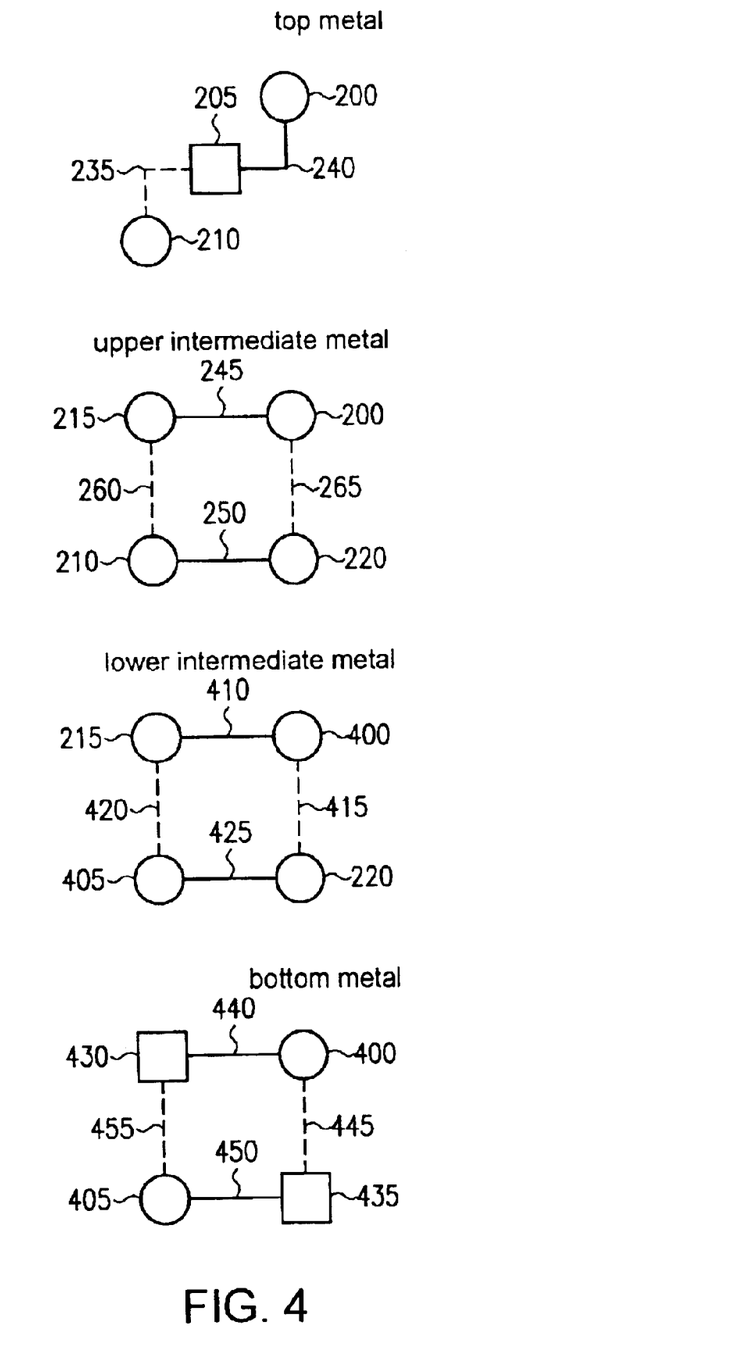
FIG. 4 shows a four metal layer structure that includes via holes and metal lines arranged according to two predefined configurations for each metal layer, according to another embodiment.

Turning now to FIG. 4, which illustrates the layer structure of FIG. 2 with an additional intermediate metal layer.

That is, the four metal layer structure is of substantially the same construction as shown in FIG. 2, but differs in the upper and lower intermediate layer.

As can be seen, the upper and lower intermediate layers have each the same construction. Similarly, structures having five or more layers may be built having further intermediate metal layer, wherein each further additional intermediate metal layer has also the same construction like depicted in FIG. 4.

It is to be noted, that the four layer structure of FIG. 4 comprises a signal path that connects tap 205 with one of taps 430 or 435. The dashed depicted metal lines indicate a respective second predefined configuration for each metal layer. By selecting a second configuration for at least one of the metal layers, a combination of first and second configurations may be chosen that offers the possibility to connect the tap 205 with the respective other tap. Thus, by switching the configuration in one arbitrary layer, the signal path can be switched.

The fact that the construction of FIG. 2 consumes less chip area is also valid for the illustrated four layer structure. Furthermore, it can be seen that for this reason not only a via hole and a tap but even two (or more) via holes 200 and 400, or 210 and 405, may be located one upon the other.

Figure 5:
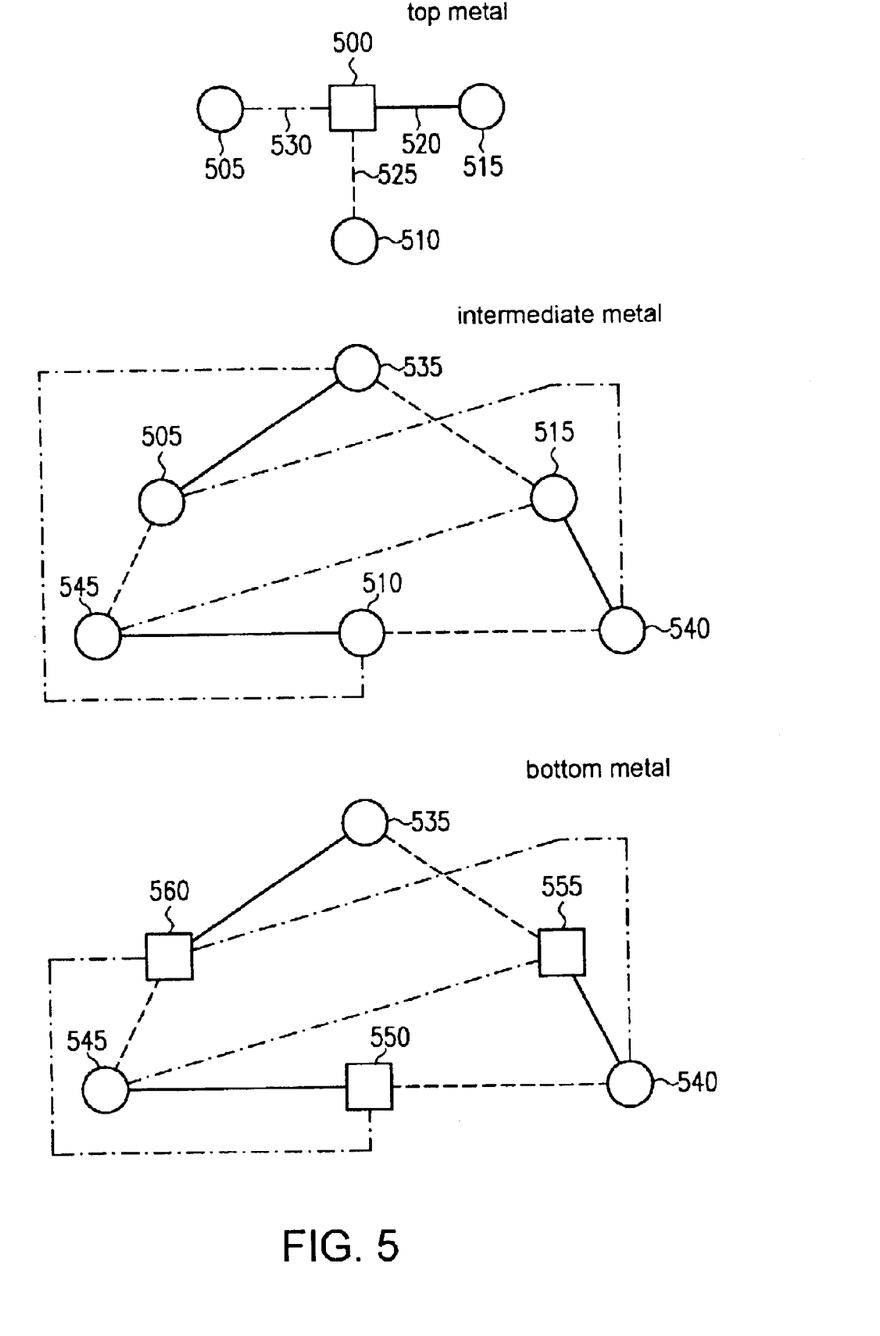
FIG. 5 shows a three metal layer structure that includes via holes and metal lines arranged according to three predefined configurations for each metal layer, according to a further embodiment.

With reference to FIG. 5, a three layer structure is illustrated according to another embodiment. The three layer structure comprises three arrangements of metal lines according to three predefined configurations, wherein each configuration is drawn in the figure using different styles of the respective lines.

Similar to the previously presented metal layer structures, the present layer structure has one existing signal path that connects the tap 500 to one of the taps 550, 555 and 560. The usage of other metal lines that are arranged according to the respective other predefined configurations, results in a respective other signal path that connects tap 500 with another tap of the bottom metal layer.

Figure 6:
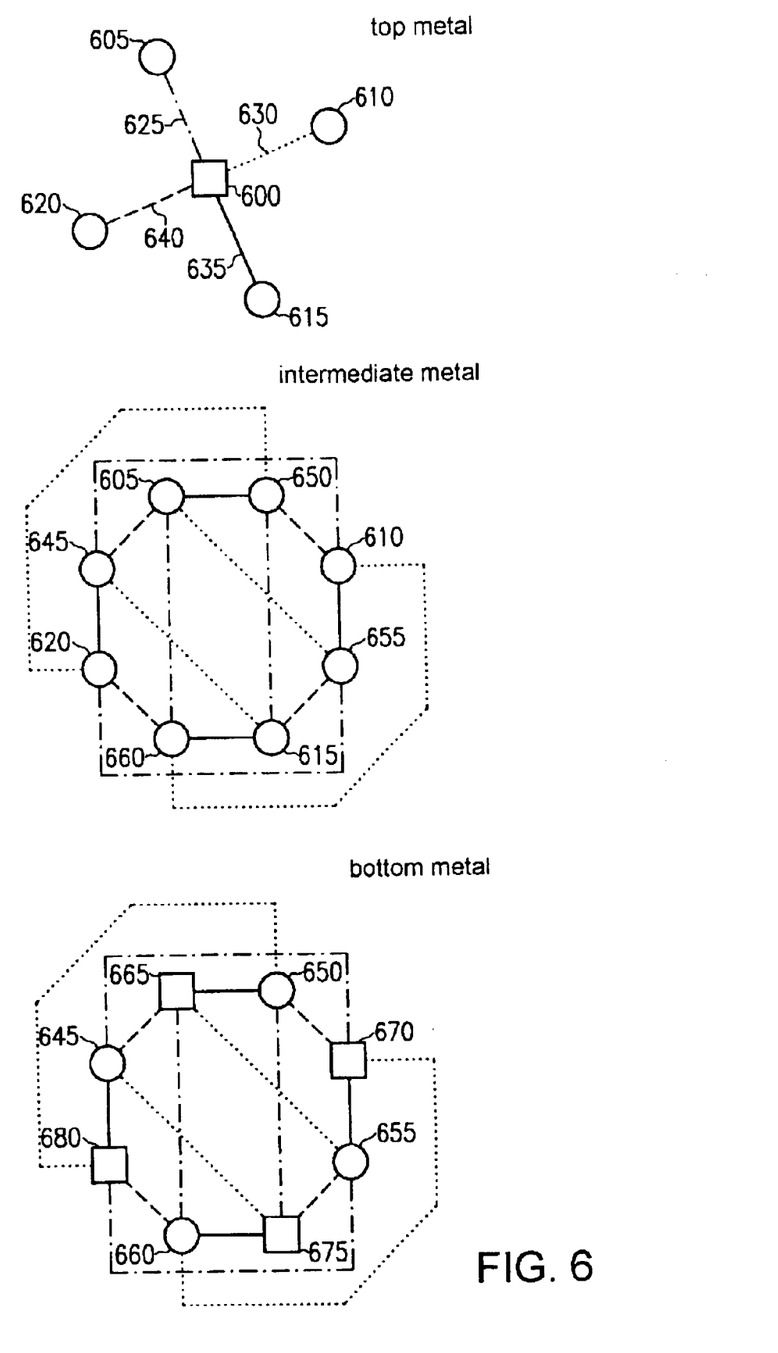
FIG. 6 shows a three metal layer structure that includes via holes and metal lines arranged according to four predefined configurations for each metal layer, according to another embodiment.

Referring now to FIG. 6, a three layer structure is illustrated according to another embodiment that comprises four arrangements of metal lines according to four predefined configurations per layer.

The construction of metal lines illustrated in FIG. 6 is similar to those shown in FIG. 5, but the present layer structure differs in the number of predefined configurations. The three layer structure example of FIG. 6, and the three layer structure presented in FIG. 5, show that the number of predefined configurations is arbitrarily extendable.

Furthermore, as already exemplarily shown in FIG. 4, the metal layer structure presented in FIGS. 5 and 6 may also be extended in the number of metal layers. So, embodiments exist having any number of metal layers and any number of configurations.

Figure 7:
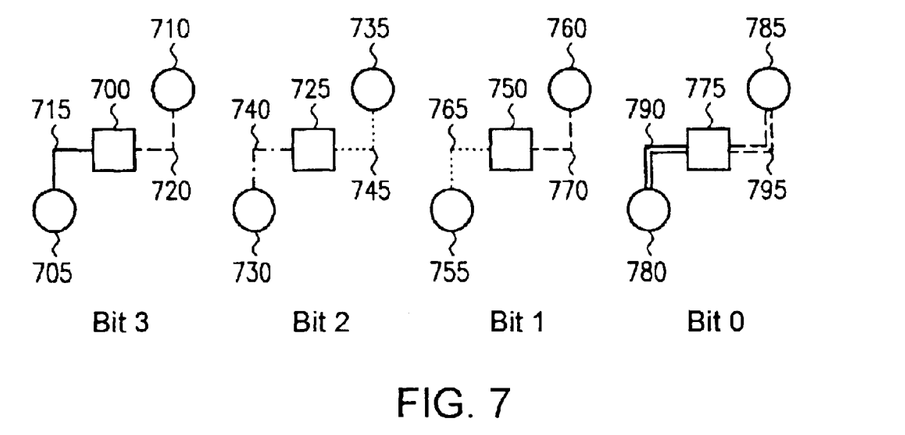
FIG. 7 is a top view of a structure for coding a four bit binary code according to another embodiment.

Turning now to FIG. 7, which illustrates a metal layer structure according to a further embodiment, the present metal layer structure comprises a system of four taps located in a top metal layer of the metal layer structure. In the figure, the taps 700, 725, 750 and 775 are shown in a top view. Each of the taps may be a signal sink, and so the taps 700, 725, 750 and 775 are referred to in the following as signal sinks.

The signal sinks are used to code a four bit revision register that is implemented by the metal layer structure to provide an identification to identify the revision of the metal layer structure. Each of the shown signal sinks is electrically decoupled from each other, and is further connected with a tap in the bottom metal layer of the structure. For each sink in the top metal layer, there are provided two taps in the bottom metal layer that function as signal sources.

As mentioned above, each sink is connected with one of two provided signal sources, namely a first or a second signal source, in the bottom metal layer. The connection of each sink with the respective first or second signal source is realized by forming a signal path for each sink, that contains respective via holes and metal lines, wherein the metal lines are arranged according to a first or second predefined configuration.

The first and the second signal source provide a first and a second signal, wherein the first signal has a voltage value that represents a high logic level, and a second signal a low logic level, respectively. The number of sinks shown in FIG. 7 defines the number of bits to be coded for the revision identification. The present embodiment of the metal layer structure comprises a four bit coding, so that each signal sink of the top metal layer is either connected with the high logic level or the low logic level to the respective signal source. This has to be done during the design phase of the metal layer structure by preparing the layout mask of each metal layer to provide, as mentioned above, the respective signal paths.

In the following, it may be assumed that an existing metal layer structure has been manufactured according to the above-described requirements and further, only one layer of this metal layer structure needs to be corrected. The metal layer structure of the shown bit code system allows then to adapt the revision identification of the chip by switching one or more configurations in only that layer that is to be corrected. Thus, there is no longer a need for generating extra layout masks just for updating the revision number.

It is to be noted that the number of four structures in FIG. 7 is chosen for explanatory reasons only, and in other embodiments, any other number of structure, i.e. any other bit width, may be selected.

Further, it is to be noted that the number of metal layers presented for all embodiments is chosen for explanatory reasons only, and in particular the four structure embodiment of FIG. 7 is not limited to any number of metal layers.

Figure 8:
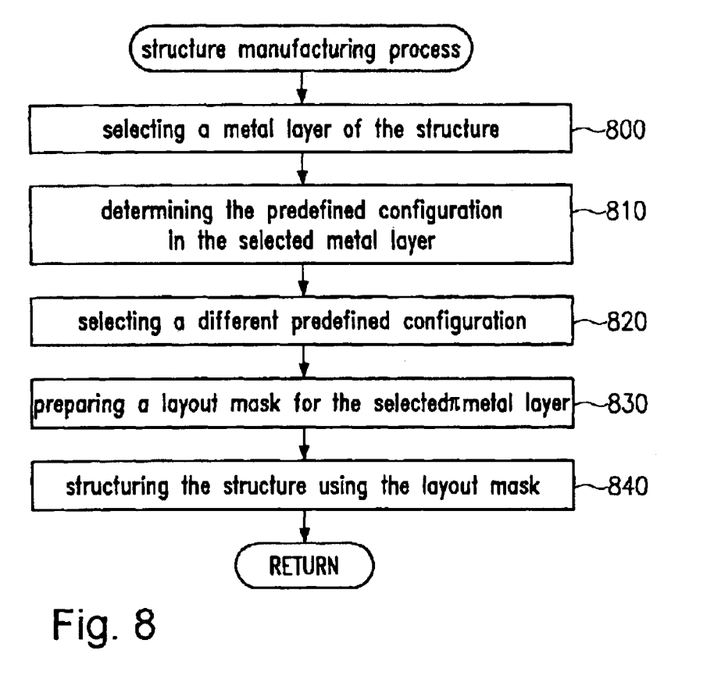
FIG. 8 is a flow chart illustrating a structure manufacturing process according to another embodiment.

Turning now to FIG. 8, the flow chart illustrates a structure manufacturing process according to another embodiment. Based on the fact that a metal layer structure was manufactured in accordance with the above-described arrangements of via holes and predefined configurations of metal lines, and based on the assumption that a correction of connections in the metal layer structure has to be performed, the first step 800 of the process comprises the selection of a metal layer that needs to be corrected. In accordance with the number of provided bits for coding the revision identification, the predefined configuration in the selected metal layer has to be determined in the step 810. If there are more than one structures provided (such as in the arrangement of FIG. 7), step 810 may be performed for each of the structures.

When the used predefined configuration is determined, the next step 820 then comprises the selection of a different predefined configuration for changing the respective signal path, e.g. to deliver the respective another logic level according to the desired revision identification.

The following step of the structure manufacturing process is step 830, which comprises a preparation of a layout mask for the selected metal layer, wherein in the example of coding bits, the signal path of each signal sink to a signal source has to be considered. The preparation of a layout mask includes an adaptation of the layout mask for implementing the correction of the metal layer circuitry. To implement the performed correction and adaptation of the revision identification, the metal layer structure is finally structured using a prepared layout mask (step 840).

Figure 9:
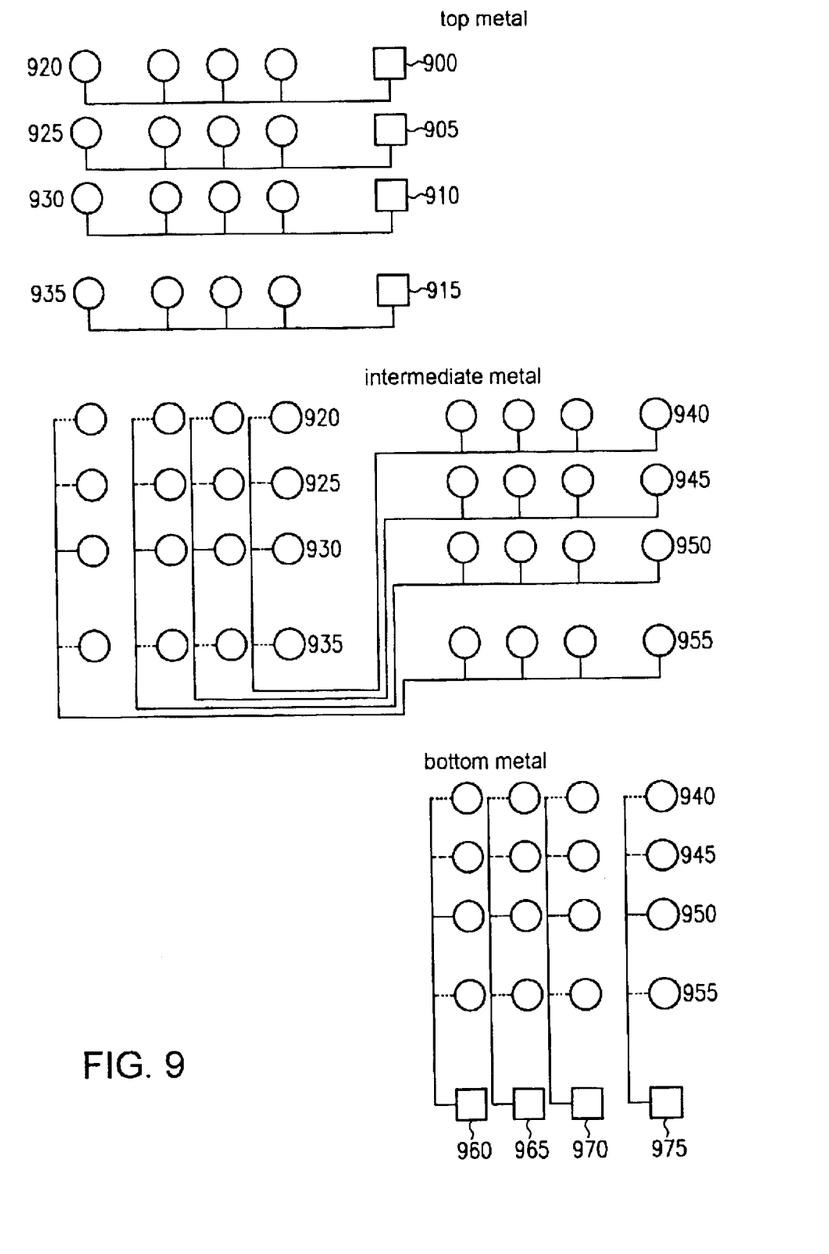
FIG. 9 shows a top view of a three metal layer structure that illustrates an extension of the number of via holes and metal lines, according to another embodiment.

Turning now to FIG. 9, a three metal layer structure is shown according to a further embodiment. The figure illustrates an extension of the number of taps, wherein taps 960–975 are signal sources and taps 900–915 are signal sinks.

Similar to the above described embodiments, the present three metal layer structure comprises a bottom, an intermediate, and a top metal layer. The bottom and the intermediate metal layers comprise metal lines drawn in different line styles, and the metal layers are connected with each other by using via holes 940–955. As can be seen, the via holes 940–955 are arranged to form a first matrix comprising rows and columns of via holes, wherein each column is formed by via holes indicated as 940–955. For each column of the first matrix, only one of the differently drawn metal lines is used to connect a via hole of the column to a related signal source 960–975, wherein only one connection is allowed for each row of the first matrix.

Further via holes 920–935 are provided to connect the intermediate metal layer with the top metal layer. The via holes 920–935 are arranged to form a second matrix comprising rows and columns of via holes, wherein each column in the second matrix is formed by the via holes indicated as 920–935.

The differently drawn metal lines of the second matrix are used to connect an individual via hole of each column to a related signal sink 900–915 of the top layer, wherein only one connection is allowed for each row of the second matrix. The remaining metal lines in the intermediate metal layer are arranged to connect the first matrix of via holes with the second matrix of via holes to deliver signals that are generated in the bottom metal layer to the top metal layer.

Each signal generated from the signal sources 960–975 of the bottom metal layer is then delivered to a signal sink 900–915 of the top metal layer, wherein the above-described construction of via holes and metal lines provides a plurality of possible different assignments from the signal sources 960–975 to the signal sinks 900–915.

In several of the above described embodiments, the number of predefined configurations is equal to the number of signal sources for each metal layer. In other embodiments the number of predefined configurations may be greater than the number of signal sources, for instance equal to the factorial number of signal sources for each metal layer.

As is apparent from the foregoing description, all of the embodiments as described may advantageously provide a universal layout arrangement because of the flexible and reversible signal assignment of the signal paths. Further, the arrangements may have the advantage that the devices consume only very little chip area due to the substantially vertical arrangement.

The above-described technique provides, compared to a conventional metal layer structure, the advantage that only the structure of one layout mask has to be changed, and therefore the above-described technique reduces manufacturing costs.

In addition, the fact that no extra adaptation of the revision register in other layers is necessary, simplifies the manufacturing. This is because a revision identification can be changed in any changed metal mask and, therefore, there is no need to generate extra masks just for updating this identification. Thus, the arrangements may have the advantage to allow for reducing the number of masks for metal spins.

Furthermore, the arrangements may have the additional advantage to provide additional flexibility by via hole connections through metal layers that can be "removed" in each layer to disconnect the signal from the source.

As apparent from the forgoing, additional flexibility may be added by increasing the number of not only the metal layer but also the taps, i.e. sinks or sources.

While the invention has been described with respect to the physical embodiments constructed in accordance therewith, it will be apparent to those skilled in the art that various modifications, variations and improvements of the present invention may be made in the light of the above teachings and within the purview of the appended claims without departing from the spirit and intended scope of the invention. In addition, those areas in which it is believed that those of ordinary skill in the art are familiar, have not been described herein in order not to unnecessarily obscure the invention described herein. Accordingly, it is to be understood that the invention is not to be limited by the specific illustrative embodiments, but only by the scope of the appended claims.

What is claimed is:

1. An integrated circuit chip comprising a metal layer structure having at least three substantially horizontal metal layers and a plurality of substantially vertical via holes; each of said metal layers comprising at least one metal line; each of said via holes electrically connecting a metal line of one metal layer with a metal line of another metal layer; the integrated circuit chip further comprising a first tap located in a first one of said metal layers and a second and third tap located in a second one of said metal layers; the metal lines and via holes forming a signal path electrically connecting said first tap with said second tap; the metal lines in each metal layer being arranged in a respective first one of at least two predefined configurations; said at least two predefined configurations comprising for each metal layer a second predefined configuration arranging the metal lines in said metal layer to form, together with the via holes and the metal lines in the other metal layers, a modified signal path electrically connecting said first tap with said third tap.

2. The integrated circuit chip of claim 1, wherein said first tap is a signal sink and said second and third taps are signal sources.

3. The integrated circuit chip of claim 1, wherein said first tap is a signal source and said second and third taps are signal sinks.

4. The integrated circuit chip of claim 1, wherein said first tap is a signal sink, said second tap is a signal source and said third tap has no connection to a point of stable electrical potential so that the potential of said third tap is floating.

5. The integrated circuit chip of claim 1, wherein for each metal layer, the metal lines are differently arranged in each configuration.

6. The integrated circuit chip of claim 1, wherein said at least three substantially horizontal metal layers include one top metal layer, at least two intermediate metal layers and one bottom metal layer.

7. The integrated circuit chip of claim 6, wherein the predefined configurations assigned to a first one of said intermediate layers are the same as the predefined configurations assigned to a second one of said intermediate layers.

8. The integrated circuit chip of claim 1, wherein at least two of said via holes are vertically arranged one upon the other.

9. The integrated circuit chip of claim 1, wherein either the first tap or the second and third taps are signal sources, and the other taps are signal sinks, and the number of predefined configurations for each metal layer is equal to or greater than the number of signal sources.

10. The integrated circuit chip of claim 9, wherein the number of predefined configurations for each metal layer is equal to the factorial number of signal sources.

11. The integrated circuit chip of claim 9, wherein the number of signal sinks is one.

12. The integrated circuit chip of claim 9, wherein said number of signal sources is two.

13. The integrated circuit chip of claim 12, wherein one of the signal sources provides a first signal and the other one of the signal sources provides a second signal, wherein the first signal has a voltage value representing a high logic level whereas the second signal has a voltage value representing a low logic level.

14. The integrated circuit chip of claim 1, wherein said at least three metal layers comprise a top metal layer, at least one intermediate metal layer and one bottom metal layer, wherein said first one of said metal layers is said top metal layer and said second one of said metal layers is said bottom metal layer.

15. The integrated circuit chip of claim 1, wherein said at least three metal layers comprise a top metal layer, at least one intermediate metal layer and one bottom metal layer, wherein said first one of said metal layers is said bottom metal layer and said second one of said metal layers is said top metal layer.

16. The integrated circuit chip of claim 15, wherein the arrangements of metal lines in the first and second predefined configurations of said at least one intermediate layer are rotated by 90 degree compared with each other.

17. The integrated circuit chip of claim 1, wherein the arrangements of metal lines in the first and second predefined configurations of at least one of said metal layers are rotated by 90 degree compared with each other.

18. The integrated circuit chip of claim 1, wherein the arrangements of metal lines in the first and second predefined configurations of at least one of said metal layers are rotated by 180 degree compared with each other.

19. The integrated circuit chip of claim 1 comprising another metal layer structure of metal layers comprising metal lines and via holes, both metal layer structures being electrically decoupled from each other.

20. The integrated circuit chip of claim 19, wherein said both metal layer structures each comprise the same structure of metal lines for each layer.

21. An integrated circuit chip having a revision identification register storing revision identification data, and an output port connected to said revision identification register to output said revision identification data, said revision identification register comprising a metal layer structure having at least three substantially horizontal metal layers and a plurality of substantially vertical via holes; each of said metal layers comprising at least one metal line; each of said via holes electrically connecting a metal line of one metal layer with a metal line of another metal layer; the integrated circuit chip further comprising a first tap located in a first one of said metal layers and a second and third tap located in a second one of said metal layers; the metal lines and via holes forming a signal path electrically connecting said first tap with said second tap; the metal lines in each metal layer being arranged in a respective first one of at least two predefined configurations; said at least two predefined configurations comprising for each metal layer a second predefined configuration arranging the metal lines in said metal layer to form, together with the via holes and the metal lines in the other metal layers, a modified signal path electrically connecting said first tap with said third tap.

* * * * *